United States Patent [19]

Barnes et al.

[11] Patent Number: 5,284,549
[45] Date of Patent: Feb. 8, 1994

[54] SELECTIVE FLUOROCARBON-BASED RIE PROCESS UTILIZING A NITROGEN ADDITIVE

[75] Inventors: Michael S. Barnes, Mahopac; Melanie M. Chow; John C. Forster, both of Poughkeepsie; Michael A. Fury, Fishkill; Chang-Ching Kin, Poughkeepsie; Harris C. Jones, Stormville; John H. Keller, Poughkeepsie; James A. O'Neill, New City, all of N.Y.

[73] Assignee: International Business Machines Corporation, Armonk, N.Y.

[21] Appl. No.: 816,190

[22] Filed: Jan. 2, 1992

[51] Int. Cl.⁵ .............................. H01L 21/00
[52] U.S. Cl. ...................... 156/662; 156/643; 156/646; 156/665; 156/654; 156/657; 437/195; 437/228
[58] Field of Search .............. 156/643, 646, 665, 656, 156/657, 654; 437/195, 228

[56] References Cited

U.S. PATENT DOCUMENTS

| | | | |
|---|---|---|---|
| 4,666,555 | 5/1987 | Tsang | 156/643 |
| 4,668,338 | 5/1987 | Maydan et al. | 156/643 |
| 4,741,799 | 5/1988 | Chen et al. | 156/643 |
| 4,767,724 | 8/1988 | Kim et al. | 437/194 |
| 4,872,947 | 10/1989 | Wang et al. | 156/643 |
| 4,904,341 | 2/1990 | Blaugher et al. | 156/643 |
| 4,956,043 | 9/1990 | Kanetomo et al. | 204/298.31 |

FOREIGN PATENT DOCUMENTS 1-33323  5/1989  Japan.
3-204928 9/1991 Japan.

*Primary Examiner*—Brian E. Hearn
*Assistant Examiner*—George Goudreau
*Attorney, Agent, or Firm*—Harold Huberfeld; Jeffrey L. Brandt

[57] ABSTRACT

A $CHF_3$-based RIE etching process is disclosed using a nitrogen additive to provide high selectivity of $SiO_2$ or PSG to $Al_2O_3$, low chamfering of a photoresist mask, and low RIE lag. The process uses a pressure in the range of about 200–1,000 mTorr, and an appropriate RF bias power, selected based on the size of the substrate being etched. The substrate mounting pedestal is preferably maintained at a temperature of about 0° C. Nitrogen can be provided from a nitrogen-containing molecule, or as $N_2$. He gas can be added to the gas mixture to enhance the RIE lag-reducing effect of the nitrogen.

6 Claims, No Drawings

SELECTIVE FLUOROCARBON-BASED RIE PROCESS UTILIZING A NITROGEN ADDITIVE

FIELD OF THE INVENTION

The present invention relates generally to etching and more particularly to the selective reactive ion etching of silicon dioxide and phosphosilicate glass (PSG).

BACKGROUND OF THE INVENTION

Known plasma or reactive ion etching (RIE) processes for selectively etching silicon dioxide (or PSG) layers on semiconductor chips require heretofor inadequate trade-offs between chamfering of the photoresist, etch rate selectivity between the $SiO_2$ layer and an etch stop, and "RIE lag" (the phenomenon where large area via holes are etched more rapidly than small area via holes on the same chip). Such RIE processes are typically optimized for a particular use by varying the chemistry, pressure, flow rate, and power parameters of the environment.

High pressure (i.e., pressures greater than 1 Torr) fluorocarbon RIE processes are desirable in that they provide good selectivity of silicon dioxide. Such processes include, for example, $CHF_3+CF_4+Ar$, and $CHF_3+He$ chemistries. However, these high pressure processes have been found to provide particularly poor RIE lag characteristics.

Low pressure fluorocarbon processes are desirable for selective etching of silicon dioxide, in that they provide less RIE lag than the high pressure processes described above. Such processes include, for example $CHF_3+He$ chemistry at 0.5-100 mTorr pressure. In fact, such processes function adequately in low density, low power, batch reactors. Such processes, however, provide unacceptable chamfering of photoresist mask layers when used in higher power, single wafer reactors. This chamfering results in loss of critical dimensions, requiring the use of undesirably large ground rules.

Low pressure, high density processes, which utilize plasma generation mechanisms such as magnetrons, inductive coupling, or electron cyclotron resonance, reduce the photoresist mask chamfering typically found with the lower pressure processes. However, this class of RIE processes provides poor selectivity to the silicon dioxide, and may result in polymer-induced RIE lag within small via openings.

Anisotropic silicon etching (whereby near-vertical etched silicon profiles are achieved) using $NF_3$ or $SF_6$ as a primary etchant, and $CHF_3$ and $N_2$ as additives, are known in the art. See U.S. Pat. No. 4,741,799, issued on May 3, 1988, to Lee Chen et al. and assigned to the present assignee. This particular etching system is useful for selectively etching silicon through a silicon dioxide mask.

In U.S. Pat. No. 4,767,724, issued on Aug. 30, 1988, to Manjin J. Kim et al., a mixture of $CHF_3$ and argon is mentioned as "not the preferred etching gas" for etching vias in silicon dioxide down to an aluminum oxide etch-stop layer. For high selectivity between the etching rates of $SiO_2$ and $Al_2O_3$, Kim et al. recommends a gas mixture of $NF_3$ and argon.

Nitrogen trifluoride with argon, but without a carbon-containing gas such as $CHF_3$, is shown in U.S. Pat. No. 4,904,341, issued on Feb. 27, 1990, to Richard D. Blangher et al., for etching $SiO_2$ while avoiding unwanted polymer by-products which carboncontaining etch gases are prone to leave on the circuit workpiece and on the walls of the reactor.

Etching of oxide selectively to tantalum with mixtures of fluorine containing and nitrogen containing molecules is taught in Japanese Kokai No. 1-33323.

While various high and low pressure, fluorocarbon-based, RIE processes are known in the art, all of these processes require an unacceptable trade-off between selectivity, mask chamfering, and RIE lag. No process is known for selectively etching $SiO_2$ (or PSG) which simultaneously yields acceptable photoresist chamfering, high selectivity, and good (i.e. low) "RIE lag" characteristics.

OBJECTS OF THE INVENTION

An object of the present invention is to provide a new and improved process and apparatus for selectively etching $SiO_2$ or PSG over an etch stop layer, this process and apparatus simultaneously providing low photoresist (i.e. mask) chamfering, high selectivity between the etched layer and an underlying etch stop layer, and low RIE lag.

Another object of the present invention is to provide such a process and apparatus with which vias of disparate dimensions (i.e. less than 1 micron and greater than 30 microns) can be etched without degrading the integrity of the etch stop layer.

A further object of the present invention is to provide such an apparatus and process which can etch vias of disparate depths (i.e. from 0.2-4.0 microns) while preserving the integrity of the underlying etch stop layer.

Another object of the present invention is to provide a $CHF_3$-based RIE process suitable for selectively etching $SiO_2$ or PSG over one of several selected etch stops on integrated circuit chips.

SUMMARY OF THE INVENTION

In accordance with one aspect of the invention, there is provided a reactive ion etching environment for selectively etching $SiO_2$ or PSG over an etch stop material on a workpiece in an etching chamber, comprising: a gas mixture including $CHF_3$ and a nitrogen containing molecule; and, the gas mixture maintained at a pressure in the range of about 200 to about 1000 mTorr. The nitrogen containing molecule is preferably $N_2$. The etch stop material is preferably selected from the group consisting of magnesium oxide, aluminum oxide, silicon, and titanium silicide. The etching environment further preferably includes a pedestal for mounting the workpiece at a temperature below about 0° C. RF power is selected appropriately for the wafer size, for example in the range of about 500-700 watts for a 125 mm substrate. Helium can be selectively added to the gas mixture to even further reduce the RIE lag.

In accordance with another aspect of the invention, there is provided a reactive ion etching method for selectively etching $SiO_2$ or PSG over an etch stop material on a workpiece in an etching chamber, comprising the steps of: introducing a gas mixture including $CHF_3$ and a nitrogen containing molecule into the chamber; and, maintaining the gas mixture at a pressure in the range of about 200 to about 1,000 mtorr. The nitrogen containing molecule is preferably $N_2$. The etch stop material is preferably selected from the group consisting of magnesium oxide, aluminum oxide, silicon, and titanium silicide. The etching process further preferably includes a pedestal for mounting the workpiece at a temperature below about 0° C., and a source of RF power in the range of about 500-700 watts for exciting the gas mixture. Helium can be added to the gas mixture to even further reduce the RIE lag.

DETAILED DESCRIPTION OF THE INVENTION

The present inventors have discovered that high selectivity of etched $SiO_2$ or PSG, to an etch stop such as $Al_2O_3$, can be achieved by inhibiting the etching of the etch stop material, which in turn can be achieved by reducing the gas radical and ion vibrational temperature of a RIE etching plasma. The addition of a nitrogen containing molecule (such a molecule defined herein as including the pure nitrogen molecule $N_2$), to a $CHF_3$ RIE gas plasma has been discovered to be beneficial in this effect, in that nitrogen has vibrational states close to those of the fluorocarbons, and thus functions as a plasma vibrational energy sink. Moreover, it is theorized that, when such nitrogen is added to the $CHF_3$ gas plasma, a thin layer of AlN forms to further inhibit the etching of the $Al_2O_3$ etch stop layer. The present inventors have further discovered that the addition of He to the gas mixture further enhances the desirable effect of nitrogen in the fluorocarbon etching gas, and that these beneficial effects are achieved at a pressure in the range of 200-1,000 mTorr, a "mid-range" pressure in comparison to the background art discussed above.

The present invention is more specifically directed to a RIE process for selectively etching $SiO_2$ or PSG over an etch stop material, utilizing a $CHF_3$/nitrogen-containing-molecule gas mixture and the following parameters: a pressure in the range of about 200-1,000 mTorr; an appropriate RF bias power, for example in the range of about 500-700 watts for a 125 mm substrate; and a single wafer pedestal temperature of below about 0° C. For other wafer sizes, RF bias power is appropriately scaled to provide equivalent current and power density levels. He gas can be selectively added to the gas mixture, up to approximately 75% of the total gas mixture, to further enhance the beneficial effects of the nitrogen.

The etch stop material is selected from the group comprising aluminum oxide ($Al_2O_3$), magnesium oxide (MgO), silicon and titanium silicide (TiSi). The latter two materials may have slightly lower etch rate ratios than that of $Al_2O_3$, but in general would exceed a desirable ratio of 20:1.

The present inventors have discovered that, with the materials and process parameters set out above, the RIE process yields a desirably high etched layer/etch stop, etch rate selectivity of greater than 20:1 (i.e. greater than 50:1 for an $Al_2O_3$ etch stop), a desirably low RIE lag of below about 20%, and a desirably steep via profile in the etched layer of substantially 90°.

The results shown in Table A were obtained when the indicated plasma etching parameter values were used in a single wafer etching chamber. A suitable chamber is manufactured and sold by Applied Materials Corporation under Model No. 5000, and may be routinely modified by the user to obtain the operating parameters specified in Table A. In all thirteen examples set forth in Table A the etched layer is $SiO_2$ the etch stop material utilized is $Al_2O_3$ and the temperature of the pedestal for mounting the wafer is 0° C. In example 1, a single layer resist etch rate of 600 Å/minute and a profile degree of 88°-90° were measured. Similar results can be expected for examples 2-13 but were not measured. In example 1, an RIE lag of 16% for 0.9 micrometer vs. 1.6 micrometer via diameters was measured. As is pointed out in the Background of the Invention, it is known that etch processes operating at lower pressures provide less RIE lag. Since examples 2-13 are at lower pressures than example 1, it is therefore assumed that any RIE lag in these examples would be equal to or less than 16%.

TABLE A

| | EXAMPLE NO.: | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| PARAMETERS: | | | | | | | | | | | | | |
| $CHF_3$ Flow Rate (sccm) | 40 | 40 | 40 | 40 | 10 | 40 | 60 | 10 | 40 | 60 | 40 | 40 | 40 |
| $N_2$ Flow Rate (sccm) | 60 | 60 | 60 | 60 | 90 | 60 | 40 | 90 | 60 | 40 | 60 | 60 | 60 |
| Gas Mixture Pressure (mT) | 1000 | 900 | 900 | 900 | 900 | 900 | 900 | 500 | 500 | 500 | 700 | 500 | 500 |
| RF Bias Power (WATTS) | 700 | 700 | 700 | 700 | 700 | 700 | 700 | 700 | 700 | 700 | 700 | 500 | 600 |
| Magnetic Field Strength (GAUSS) | | 0 | 30 | 60 | 0 | 0 | 0 | 0 | 0 | 0 | 0 | 0 | 0 |
| RIE PROCESS RESULTS: | | | | | | | | | | | | | |
| Selectivity ($SiO_2/Al_2O_3$ Etch Rate Ratio) | >50 | 84 | 93 | 84 | 28 | 94 | 240 | 22 | 44 | 49 | 64 | 146 | 59 |
| $SiO_2$ Etch Rate (Å/min) | 2700 | 2529 | 2524 | 2516 | 2125 | 2810 | 1920 | 2204 | 3770 | 3654 | 3212 | 1756 | 2787 |
| $Al_2O_3$ Etch Rate (Å/min) | 45 | 30 | 27 | 30 | 76 | 30 | 8 | 101 | 85 | 75 | 50 | 12 | 47 |
| RIE Lag (%) | 16 | | | | | | | | | | | | |
| Etch Rate Uniformity | | 4.5 | 4.5 | 7.8 | 3.48 | 4.6 | 14.3 | 3.7 | 3.19 | 3.5 | 3.19 | 6.3 | 2.8 |

Generally, for a given power and pressure, there is an optimum amount of nitrogen that yields the above-described results. As power is increased and pressure decreased, this optimum amount of nitrogen decreases as a percentage of the total gas mixture. As power is decreased and pressure is increased, this optimum amount of nitrogen increases as a percentage of the total gas mixture. Increased pressures generally provide increased selectivity (with acceptable chamfering and RIE lag). However, if the pressure is increased outside of the range of the invention, the RIE lag becomes unacceptable. He can be added, up to approximately 75% of the total gas mixture, to further decrease the RIE lag, especially in the higher pressure ranges.

The colder the temperature at which the wafer is maintained, the greater the selectivity that can be obtained with the present RIE process. Pedestal temperatures below 0° C., and increased wafer cooling, are thus advantageous to the process. With an electrostatic chuck, He gas can be used to provide the thermal coupling between the chuck and the wafer being etched.

Other nitrogen containing molecules such as ammonia can be used with or in place of $N_2$ to provide the nitrogen required by the RIE process as described above.

The present inventors have thus provided a fluorocarbon-based RIE process for selectively etching silicon dioxide over an etch stop layer, the process simultaneously providing high etch rate selectivity, low chamfering of the photoresist etching mask, and low RIE lag. The process has application in the etching of $SiO_2$ or PSG on semiconductor chips, and particular application in such etching as used to fabricate very-large scale integrated (VLSI) circuits.

While the present invention has been shown and described with respect to selected embodiments, it is not thus limited. Numerous modifications, changes, and improvements will occur to those skilled in the art and which are all within the spirit and scope of the invention.

What is claimed is:

1. A method for selectively reactive ion etching $SiO_2$ over an aluminum oxide etch stop material on a workpiece in an etching chamber, comprising the steps of:

introducing a gas mixture including $CHF_3$ and a nitrogen containing molecule into said chamber at flow rates of between 40 sccm and about 60 sccm; and maintaining said gas mixture at a pressure in the range of 500 to 1,000 mtorr.

2. The etching process of claim 1 wherein said nitrogen containing molecule is $N_2$.

3. The etching process of claim 1 and further including a pedestal for mounting said workpiece, the temperature of said pedestal being below 0° C.

4. The etching process of claim 1 wherein:

said workpiece consists of a single wafer of 125 mm diameter; and further comprising a source of RF power in the range of about 500–700 watts for exciting said gas-mixture.

5. The etching process of claim 1 wherein said gas mixture further includes He.

6. The etching process of claim 1 wherein the gas flow rates of said $CHF_3$ and $N_2$ are 40 and 60 sccm, respectively.

* * * * *